United States Patent
Dalton et al.

(10) Patent No.: US 6,724,069 B2
(45) Date of Patent: Apr. 20, 2004

(54) SPIN-ON CAP LAYER, AND SEMICONDUCTOR DEVICE CONTAINING SAME

(75) Inventors: Timothy Joseph Dalton, Ridgefield, CT (US); Stephen McConnell Gates, Ossining, NY (US); Jeffrey Curtis Hedrick, Montvale, NJ (US); Satyanarayana V. Nitta, Poughquaq, NY (US); Sampath Purushothaman, Yorktown Heights, NY (US); Christy Sensenich Tyberg, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/827,160

(22) Filed: Apr. 5, 2001

(65) Prior Publication Data

US 2002/0145200 A1 Oct. 10, 2002

(51) Int. Cl.$^7$ ............................ H01L 23/58; H01L 23/48
(52) U.S. Cl. ........................ 257/642; 257/643; 257/759; 257/762
(58) Field of Search ................................. 257/632, 626, 257/637, 640, 642, 643, 758, 759, 762; 438/114, 118, 465, 622

(56) References Cited

U.S. PATENT DOCUMENTS 5,760,480 A * 6/1998 You et al. .................. 257/783
6,316,351 B1 * 11/2001 Chen et al. ................. 438/638

OTHER PUBLICATIONS

Goldblatt, et al., "A High Performance 0.13 μm Copper BEOL Technology with Low–k Dielectric," IEEE, 2000, pp. 1–3.
Loke, et al., "Evaluation of Copper Penetration in Low–k Polymer Dielectrics by Bias–Temperature Stress," Mat. Res. Soc. Symp. Proc., vol. 565, 1999, pp. 173–187.
U.S. patent application Ser. No. 09/371,340, Cohen et al., filed Aug. 10, 1999.

* cited by examiner

Primary Examiner—Hung Vu
(74) Attorney, Agent, or Firm—Scully, Scott, Murphy & Presser; Daniel P. Morris

(57) ABSTRACT

A spin-on cap useful as a post-CMP cap for Cu interconnect structures is provided. The inventive spin-on cap includes a low-k dielectric (on the order of 3.5 or less) and at least one additive. The at least one additive employed in the present invention is capable of binding Cu ions, and is soluble in the spun-on low-k dielectric. The spin-on cap of the present invention may further include a spun-on low-k (on the order of 3.5 or less) reactive-ion etch (RIE) stop layer. Spin-on caps containing a bilayer of low-dielectric plus at least additive and low-k RIE stop layer are preferred. It is noted that the inventive spin-on cap of the present invention does not significantly increase the effective dielectric constant of the interconnect structure and does not add additional cost to the fabrication of the interconnect structure since a single deposition tool, i.e., spin coating tool, is employed. Moreover, because of the presence of the additive in the spin-on cap, Cu migration is substantially minimized.

22 Claims, 4 Drawing Sheets

SPIN-ON CAP LAYER, AND SEMICONDUCTOR DEVICE CONTAINING SAME

FIELD OF THE INVENTION

The present invention relates to interconnect structures for high-speed microprocessors, application specific integrated circuits (ASICs), and other high-speed integrated circuits (ICs). More particularly, the present invention provides an interconnect structure of the dual damascene-type which includes a low dielectric constant (i.e., low-k) dielectric having Cu regions formed therein. The Cu interconnect structures of the present invention have enhanced circuit speed and reduced fabrication cost. Moreover, the inventive interconnect structures contain an inventive diffusion barrier layer that is used as a post-CMP (chemical-mechanical polishing) cap.

BACKGROUND OF THE INVENTION

Many low-k dielectrics having a dielectric constant, k, of about 3.5 or less, plus Cu interconnect structures are known in the art; See, for example, R. D. Goldblatt, et al., "A High Performance 0.13 $\mu$m Copper BEOL Technology with Low-K Dielectric", Proceedings of the International Interconnect Technology Conference, IEEE Electron Devices Society, Jun. 5–7, 2000 pgs. 261–263. Such prior art interconnect structures include inorganic, organic or mixed dielectric materials as the interlevel or intralevel dielectric. It is widely accepted that dual-damascene structures are lower cost than single damascene or subtractive metal structures.

Typically, there are two essential problems associated with prior art Cu interconnect structures which include: Cu migration out of the conductive regions into the surrounding dielectric which causes a reliability problem with the structure; and increasing cost of fabricating the interconnect structure due to increasing number of processing steps and expensive tools. A discussion concerning the problem of Cu migration in Cu interconnect structures is found, for example, in A. Loke, et al., "Evaluation of Cu Penetration in Low-k Polymer Dielectrics by Bias-Temperature Stress", Mat. Res. Soc. Symp. Proc., Vol. 565 (1999) p. 173.

Common solutions to the above problems add additional processing steps, thus further increasing the cost to fabricate the desired low-k plus Cu interconnect structure. Furthermore, the post-CMP cap layers in prior art dual damascene structures are made using vacuum-based plasma-enhanced chemical vapor deposition (PECVD) tools that are costly to purchase and maintain.

Co-assigned U.S. application Ser. No. 09/371,340 filed Aug. 10, 1999 provides an interlayer dielectric that is capable of reducing or eliminating Cu ion migration. Specifically, the interlayer dielectric of the '340 disclosure comprises a dielectric material having a dielectric constant of 3 or less and an additive. The additive employed therein is capable of binding Cu ions, is soluble in the dielectric material and is substantially, uniformly distributed throughout the dielectric. This disclosed interlayer dielectric is not used as a spin-on dielectric in the '340 disclosure.

In view of the above-mentioned problems in prior art processes of fabricating dual damascene-type structures, there is a continued need for providing a new and improved method for forming such interconnect structures which substantially minimizes Cu migration into the surrounding dielectric layers, without adding extra processing steps and cost in fabricating the interconnect structure.

SUMMARY OF THE INVENTION

One object of the present invention is to provide an interconnect structure which includes a new diffusion barrier layer (i.e., post-CMP cap) that substantially minimizes the migration of Cu into the surrounding low-k dielectrics.

A further object of the present invention is to provide a Cu interconnect structure of the dual damascene-type that is made without any vacuum-based PECVD tools.

A still further object of the present invention is to provide a Cu interconnect structure that has an effective low dielectric constant (on the order of about 3.5 or less), which is easy to manufacture and does not include extra processing steps that would increase the cost of fabricating the same.

These and other objects and advantages are achieved in the present invention by providing a diffusion barrier layer (i.e., post-CMP cap) that is based on a spin coated dielectric layer. Specifically, the diffusion barrier layer of the present invention (hereinafter referred to as spin-on cap) comprises a low-k dielectric (on the order of about 3.5 or less) that includes at least one additive. The at least one additive employed in the present invention is capable of binding Cu ions, and is soluble in the spun-on low-k dielectric. The spin-on cap of the present invention may further include a spun-on low-k (on the order of 3.5 or less) reactive-ion etch (RIE) stop layer. Spin-on caps containing a bilayer of low-dielectric plus at least one additive and low-k RIE stop layer are preferred. It is noted that the inventive spin-on cap does not significantly increase the effective dielectric constant of the interconnect structure and does not add additional cost to the fabrication of the interconnect structure since a single deposition tool, i.e., spin coating tool, is employed.

One aspect of the present invention relates to a Cu interconnect structure which includes the inventive spin-on cap as a post-CMP cap. Specifically, the inventive Cu interconnect structure comprises:

a substrate having a patterned low-k interlevel dielectric formed thereon, said patterned low-k interlevel dielectric having an effective dielectric constant of about 3.5 or less;

Cu conductive regions formed within said patterned low-k interlevel dielectric;

a polish stop layer on surfaces of said patterned low-k interlevel dielectric not containing said Cu conductive regions; and a spin-on cap present on said Cu conductive regions and said polish stop layer, wherein said spin-on cap comprises a low-k dielectric having a dielectric constant of about 3.5 or less and at least one additive, wherein said at least one additive is capable of binding Cu ions, and is soluble in the spun-on low-k dielectric.

In one embodiment of the present invention, the polish stop layer is not present on the patterned low-k interlevel dielectric. Instead, in this embodiment, the spin-on cap is formed on the patterned low-k interlevel dielectric.

Another aspect of the present invention relates to a method of fabricating the above mentioned Cu interconnect structure. Specifically, the method of the present invention comprises the steps of:

(a) forming a low-k interlevel dielectric on a surface of a substrate, said low-k interlevel dielectric having an effective dielectric constant of about 3.5 or less;

(b) forming a hard mask on said low-k interlevel dielectric, said hard mask including at least a polish stop layer;

(c) forming an opening in said hard mask so as to expose a portion of said low-k interlevel dielectric;

(d) forming a trench in said low-k interlevel dielectric using said hard mask as an etch mask;

(e) filling said trench with at least Cu;

(f) planarizing said Cu stopping on said polish stop layer; and (g) forming a spin-on cap on said Cu and said polish stop layer, wherein said spin-on cap comprises a low-k dielectric having a dielectric constant of about 3.5 or less and at least one additive, wherein said at least one additive is capable of binding Cu ions, and is soluble in the spun-on low-k dielectric.

The term "trench" as used herein denotes a line, via or a combination of a line and via. In one embodiment of the present invention, step (b) above is omitted.

DETAILED DESCRIPTION OF THE INVENTION

Figure 1A:
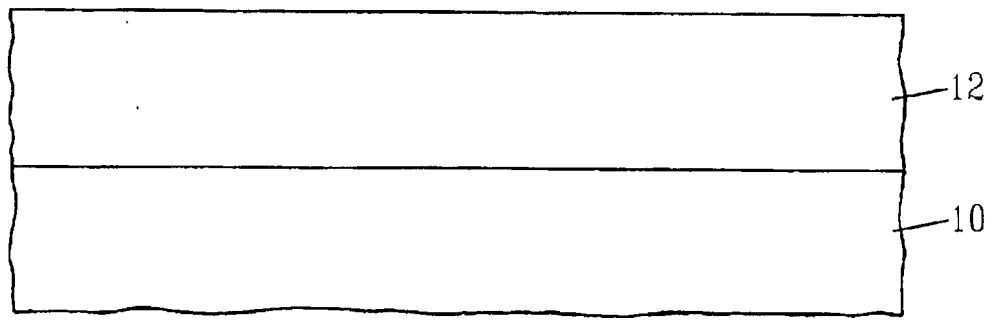
FIGS. 1A–1G are cross-sectional views of the inventive Cu interconnect structure through various processing steps of the present invention.

The present invention which provides a new spin-on cap for use in Cu interconnect structures will now be described in more detail by referring to the drawings of the present application. It is noted that in the drawings of the present application, like and/or corresponding elements are referred to by like reference numerals.

Reference is first made to FIG. 1A which is an illustration of an initial structure that is employed in the present invention. Specifically, the structure of FIG. 1A comprises substrate 10 having low-k interlevel dielectric 12 formed thereon. The interlevel dielectric has a dielectric constant of about 3.5 or less, with a dielectric constant of from about 1.4 to about 3.0 being more preferred.

The structure shown in FIG. 1A is composed of conventional materials that are well known to those skilled in the art and the structure is formed utilizing conventional spin-on coating processes that are also well known in the art. For example, substrate 10 employed in the present invention may include a dielectric layer, a wiring layer, an adhesion promoter, a buried etch stop layer, a semiconductor wafer or any combination thereof. When a semiconductor wafer is employed as the substrate, the wafer may include various circuits and/or devices formed thereon.

Figure 2:
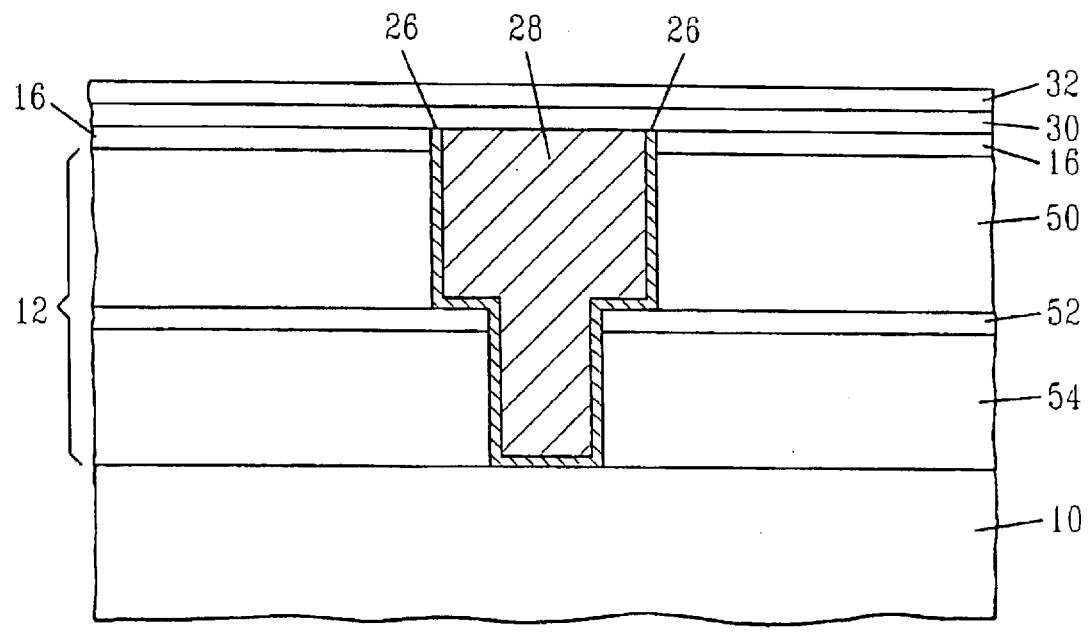
FIG. 2 shows a cross-sectional view of an alternative Cu interconnect structure of the present invention wherein the spin-on cap is a bilayer film and the interlevel dielectric includes a top spun-on low-k dielectric, a buried etch stop layer and a bottom spun-on low-k dielectric.

The low-k interlevel dielectric of the present invention may be a single layered dielectric (as shown in FIG. 1A) or multilayer dielectric (as shown in FIG. 2). When a multi-layered dielectric is employed as the interlevel dielectric, a buried etch stop layer may optionally be formed between the multilayered dielectrics.

Notwithstanding whether the interlevel dielectric is composed of a single layered dielectric or a multilayered dielectric, the interlevel dielectric employed in the present invention includes conventional spun-on organic dielectrics, spun-on inorganic dielectrics or combinations thereof which have a dielectric constant of about 3.5 or less. Suitable organic dielectrics that can be employed in the present invention include dielectrics that comprise C, O and H. Examples of some types of organic dielectrics that can be employed in the present invention include, but are not limited to: aromatic thermosetting polymeric resins, for example, resins sold by DOW Chemical Company under the tradename SiLK®, Honeywell under the tradename Flare®, and similar resins from other suppliers, and other like organic dielectrics. The organic dielectric employed as interlevel dielectric 12 may or may not be porous, with porous organic dielectric layers being highly preferred due to the reduced k value. When porous organic dielectrics are employed as the interlevel dielectric, the pore size of the organic dielectric is typically of from about 1 to about 50 nm at a volume percent porosity of from about 5 to about 35%.

When inorganic dielectrics are employed as the interlevel dielectric, the inorganic dielectrics typically comprise Si, O and H, and optionally C. Illustrative examples of some types of inorganic dielectrics that can be employed in the present invention include, but are not limited to: the silsesquioxane HOSP (sold by Honeywell), methylsilsesquioxane (MSQ), hydrido silsesquioxane (HSQ), MSQ-HSQ copolymers, tetraethylorthosilicate (TEOS), organosilanes and any other Si-containing material. In the present invention, porous or non-porous inorganic dielectrics can be used as the interlevel dielectric, with porous inorganic dielectrics being more highly preferred. While the pore size of the inorganic dielectric is not critical to the present invention, the pore size of the inorganic dielectric employed in the present invention is typically of from about 5 to about 500 Å at a volume percent porosity of from about 5 to about 80%. More preferably, the pore size of the inorganic dielectric is from about 10 to about 200 Å at a volume percent porosity of from about 10 to about 50%.

In accordance with the present invention, the interlevel dielectric is formed on the surface of substrate 10 by conventional spin-on coating processes and following the spinning operation, the resultant film is baked at a temperature that is sufficient to remove any residual solvent from the dielectric layer. When the interlevel dielectric includes multiple dielectric layers, the dielectric layers may be the same or different organic or inorganic low-k dielectric which are formed sequentially by spin-on coating in a single spin apply tool. After all layers are cured in this single step, the dielectric layer is subjected to a conventional baking step to remove residual solvent therefrom.

Moreover, when the interlevel dielectric is comprised of a multilayer of spun-on dielectrics, a conventional adhesion promoter may be used to improve the adhesion between the various dielectric layers of the multilayered interlevel dielectric. The application of the adhesion promoter includes conventional spun-on processes well known to those skilled in the art and multiple rinse and baking steps may occur after spinning-on the adhesion promoter. The multiple rinsing and baking steps ensure that all residual solvent and non-reactive adhesion promoter are removed from the bottom spun-on dielectric prior to forming the top spun-on dielectric thereon.

In a preferred embodiment of the present invention, multiple spin-on and bake steps are all integrated into one spin-on tool for manufacturing. One example of a spin apply tool that can be employed in the present invention is ACT-8 which is made by Tokyo Electron Limited.

Likewise, when a multilayer of spun-on dielectrics is employed, a buried etch stop layer (including any conventional inorganic or organic dielectric) may be formed between the successive layers using conventional spin-on coating. FIG. 2 shows a structure which includes a multi-layered interlevel dielectric and a buried etch stop layer.

It is noted that the various layers that comprise the interlevel dielectric of the present invention are composed of low-k dielectrics which are formed via spin-on coating. The use of spin-on coating eliminates the need for using conventional PECVD processes which are expensive to use; therefore reducing the overall cost of fabricating the Cu interconnect structure.

The thickness of the spun-on interlevel dielectric layer of the present invention may vary and is not critical to the present invention. Typically, however the inventive low-k interlevel dielectric has a thickness of from about 500 to about 10,000 Å.

Figure 1B:
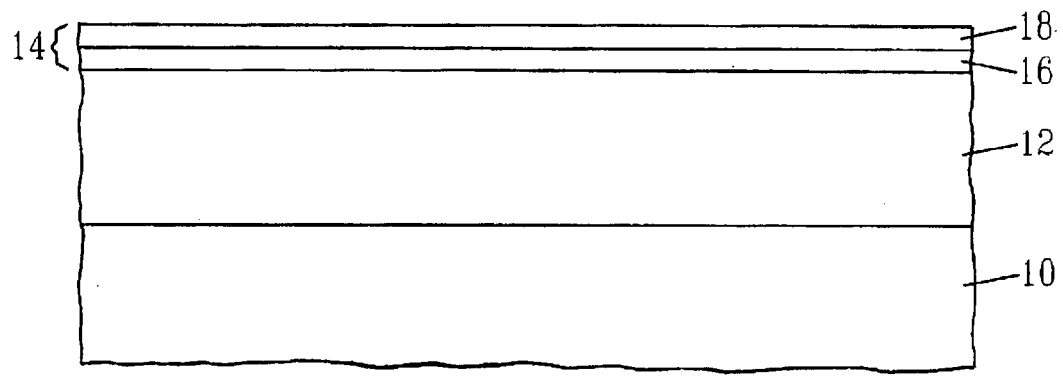

After forming the structure shown in FIG. 1A, hard mask 14 is formed on the uppermost surface of the interlevel dielectric. In accordance with the present invention, hard mask 14 includes at least polish stop layer 1 and patterning layer 18. The hard mask, which is shown in FIG. 1B, may be formed by spin-on coating or by PECVD (i.e., plasma enhanced chemical vapor deposition). Layers formed by spin-on coating are preferred over prior art PECVD hard mask layers since they reduce the number of deposition tools used in the overall process; therefore reducing the overall manufacturing cost. Moreover, although the drawings depict the presence of two layers in the hard mask, the hard mask may contain more than two layers.

The materials used in forming the hard mask may vary and are dependent upon their etch selectivity towards the layer that lies directly underneath. For example, the patterning layer employed in the present invention is a material that has high-etch selectivity (about 10:1 or greater) towards the underlying polish stop layer. The polish stop layer, on the other hand, is a material that has high-etch selectivity towards the underlying spun-on interlevel dielectric and it should have a dielectric constant that does not significantly increase the effect dielectric constant of the interlevel dielectric.

Accordingly, the patterning layer may include organic or inorganic dielectrics, while the polish stop layer may comprise inorganic or organic dielectrics. The exact nature of each layer will be dependent first upon the spun-on interlevel dielectric and then upon the polish stop layer. For example, if the spun-on interlevel dielectric is an organic dielectric, then the etch stop layer is typically an inorganic dielectric and the patterning layer is typically formed of a substantially different inorganic dielectric layer.

The thickness of each layer of the hard mask may vary and is not critical to the present invention. Typically, however, the patterning layer has a thickness of from about 100 to about 3000 Å, and the polish stop layer has a thickness of from about 100 to about 1000 Å.

Figure 1C:
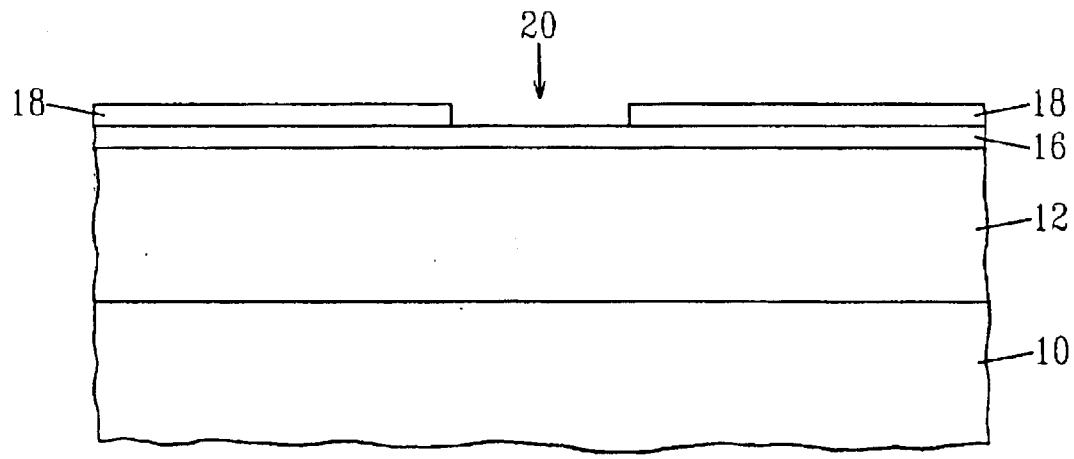

Following formation of the hard mask on the interlevel dielectric, the structure shown in FIG. 1B is then subjected to a first lithography and etching process which forms opening 20 in patterning layer 18; See FIG. 1C. Specifically, the structure shown in FIG. 1C is formed as follows: First, a photoresist (not shown in the drawings) is formed on the patterning layer using conventional deposition processes well known to those skilled in the art. The photoresist is then exposed to a pattern of radiation and thereafter the pattern is developed in the photoresist using conventional resist developers.

After developing the resist pattern, opening 20 is formed in the hard mask so as to expose a portion of the underlying polish stop layer. Specifically, the opening is formed by a conventional dry etching process including, but not limited to: reactive-ion etching (RIE), plasma etching and ion beam etching. Of these various dry etching processes, it is preferred to use RIE that includes fluorine or other halogen-based chemistries. After this etching step, the patterned photoresist is stripped from the structure utilizing conventional stripping processes well known to those skilled in the art. The resultant structure obtained from the first lithography and etching step is shown in FIG. 1C.

Figure 1D:
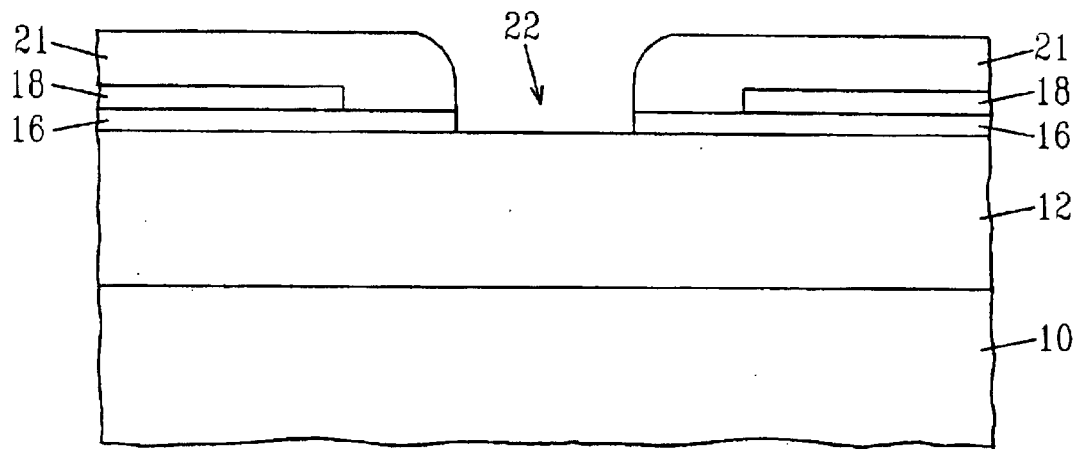

After stripping the photoresist from the structure, a new photoresist (the patterned new photoresist is labeled as 21 in FIG. 1D) is applied to the structure shown in FIG. 1C. The new photoresist is then subjected to lithography and etching so as to provide second opening 22 in the structure which exposes a surface of interlevel dielectric 12. The second etching step includes one of the aforementioned dry etching processes. Of these various dry etching processes, it is preferred to use RIE that includes fluorine-based chemistries or other halogen based chemistries. The second etch exposes the interlevel dielectric providing a structure such as shown in FIG. 1D.

Figure 1E:
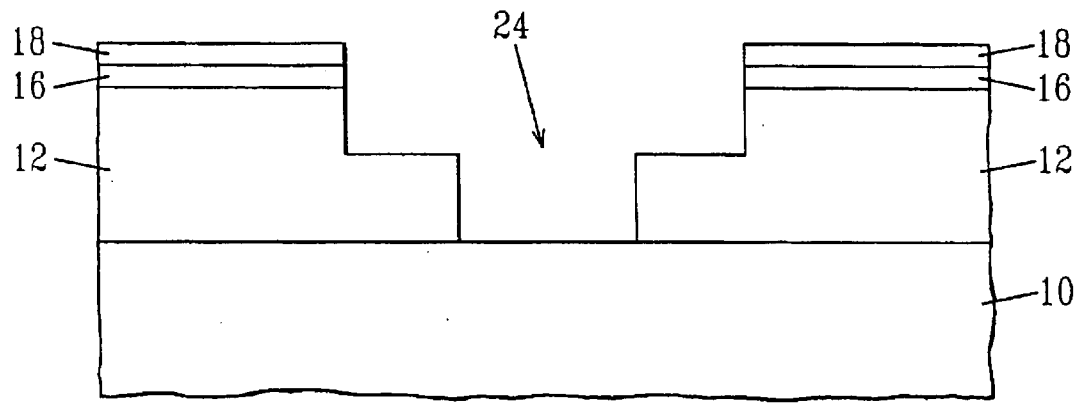

FIG. 1E shows the structure after the pattern formed in the hard mask is transferred to the interlevel dielectric and the resist is stripped. Specifically, the pattern transfer, which forms trench 24 in the interlevel, is carried out using a drying etching process that includes oxygen or a reducing chemistry such as $H_2$, $NH_3$ or a mixture of $H_2$ and $N_2$. In accordance with the present invention, trench 24 may be a via or line or both.

In another embodiment of the present invention, the dry etching process employed in forming trench 24 includes a step of using a gas mixture which comprises a first gas selected from the group consisting of $NH_3$, $H_2$, $N_2$, $H_2$ in $N_2$, $H_2$ in Ar, and $H_2$ in He, and a second gas selected from the group consisting of $CH_3F$, $CH_2F_2$, $CHF_3$, $C_2H_5F$, $C_2H_4F_2$, $C_2H_3F_3$, $C_2H_2F_4$ and $C_2HF_5$. In this embodiment of the present invention, gas mixture includes a ratio of the first gas to the second gas of from about 50:1 to about 10,000:1, with a ratio of about 500:1 being more highly preferred.

Figure 1F:
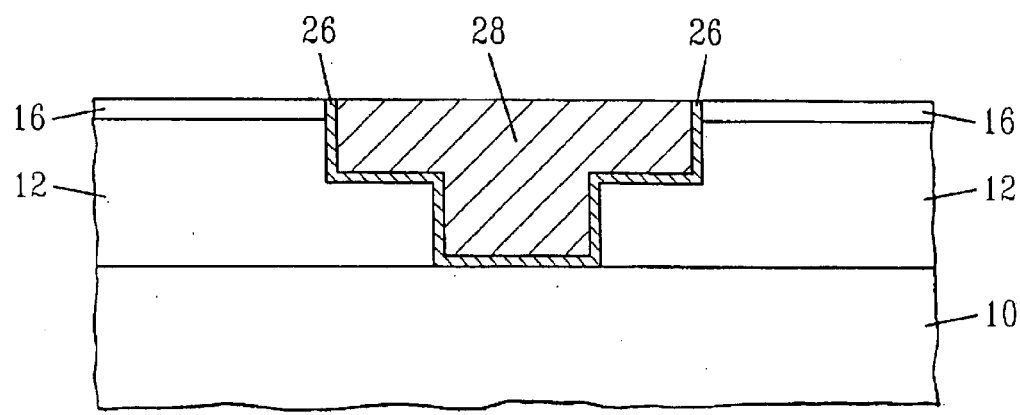

Following the pattern transfer to the interlevel dielectric, the trench is then filled with Cu 28 and planarized so as to provide the structure shown in FIG. 1F. An optional, but preferable liner material 26 may be formed in the trench prior to filling with Cu. Cu metal is formed in the trench utilizing a conventional deposition process such as chemical vapor deposition (CVD), plasma-assisted CVD, plating, sputtering, chemical solution deposition and other like deposition processes.

The optional liner material employed in the present invention includes any material which would prevent the diffusion of Cu into the dielectric layers. Some examples of such liners include, but are not limited to: TiN, TaN, Ti, Ta, W, WN, Cr, Nb and other like materials. The present invention also contemplates multilayer combinations of such liners. The liner material may be formed in the trench utilizing conventional deposition processes well known to those skilled in the art, including: CVD, plasma-assisted CVD, sputtering, plating and chemical solution deposition.

After filling the trench with Cu, the structure is subjected to a conventional planarization process such as chemical-mechanical polishing (CMP) which removes any Cu above the polish stop layer. Note that the planarization step also removes the patterning layer of the hard mask, but not the polish stop layer from the structure. Instead, the polish stop layer remains on the surface of the structure. Because of this reason, it is essential to employ a polish stop layer that has a dielectric constant that is relatively-low so as to not increase the effective dielectric constant of the interconnect structure.

Following these processing steps of the present invention additional via and wiring levels may be formed over the structure shown in FIG. 1F by repeating the processing steps of the present invention. Thus, the inventive method can be used to prepare interconnect structures that include one or more wiring and via levels present therein.

Figure 1G:
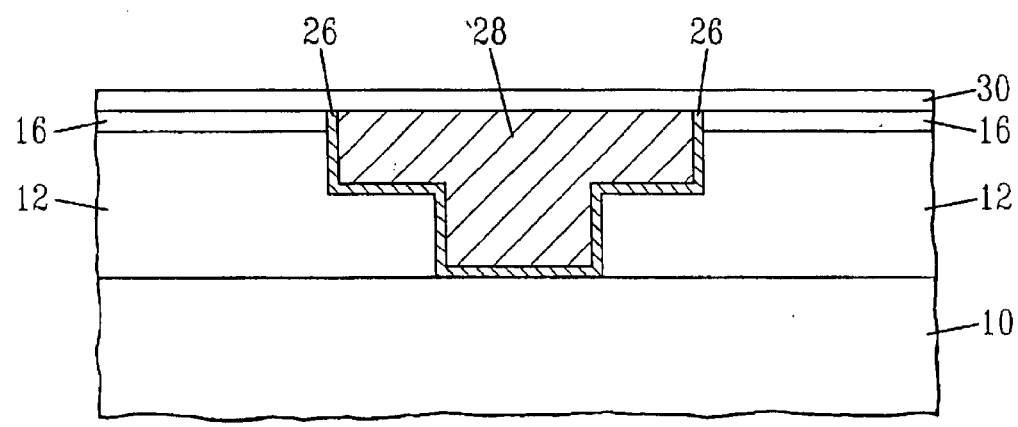

After the last planarization process, spin-on cap 30 is formed on the planarized surface of the structure including Cu regions 28 and polish stop layer 16, See FIG. 1G. In accordance with the present invention, spin-on cap 30 includes a low-k dielectric and at least one additive, wherein said additive is capable of binding Cu ions, and is soluble in the spun-on low-k dielectric. The thickness of the spin-on cap may vary, but typically it has a thickness of from about 30 to about 100 nm.

Suitable low-k dielectrics (about 3.5 or less) that can be employed as the spin-on cap include any conventional inorganic or organic dielectric material that has a dielectric constant that falls within the range mentioned above. Illustrative examples of organic dielectrics include, but are not limited to: benzocyclobutene, SiLK®, Flare® and other like low-k organic dielectrics. Illustrative examples of inorganic dielectrics that can be employed as the spin-on cap include, but are not limited to: HOSP, MSQ, HSQ, MSQ-HSQ copolymers and TEOS. A highly preferred low-k dielectric employed as the spin-on cap is benzocyclobutene. In one embodiment of the present invention, See FIG. 2, the spin-on cap is composed of a bilayer which comprises low-k dielectric plus additive and a RIE stop layer.

The at least one additive that is used in conjunction with the low-k dielectric must satisfy the following two conditions: (i) it must be capable of forming a strong bond with Cu ions, i.e., it must have a high affinity for Cu ions therefore forming a strong complex with Cu ion; and (ii) it must be soluble in the low-k dielectric thereby being essentially, uniformly distributed throughout the dielectric matrix. Illustrative examples of additives that can be employed in the present invention, include, but are not limited to: amine compounds, mercapto compounds, sulfur compounds, sulfide compounds, cyanide compounds, multidentate ligands including multidentate amines, bipyridine, ethylenediamine tetraacetate (EDTA), polymeric molecules of the compounds mentioned above, and other additives that have a strong binding affinity for Cu. A preferred additive employed in the present invention is phthalocyanine.

The additive is added to the low-k dielectric prior to spin-on coating of cap 30 using conventional solution chemistry which is capable of providing a premixed interlayer dielectric composition wherein the additive is uniformly distributed in the low-k dielectric matrix. Specifically, the premix is obtained by dissolving the additive in a solution of the dielectric or a precursor of the dielectric. Other possible means for obtaining the above premix can also be used.

It is noted that the amount of additive employed in the present invention should be sufficient to satisfy conditions (i)–(ii) mentioned above. That is, the amount of additive must provide sufficient Cu ion binding while still being soluble in the dielectric matrix. These conditions are achieved if the additive is used in amounts not to exceed $10^{-8}$ moles. Preferably, the additive is present in an amount so that from about $10^{-6}$ to about $10^{-8}$ moles of additive are present in the entire matrix of the low-k dielectric material.

It is further noted that the amount of additive employed in the present invention does not substantially increase the dielectric constant of the low-k material.

Following the application of spin-on cap 30 to the planarized structure, the entire structure may be subjected to a curing step which is capable of curing all of the dielectric layers present in the structure. Alternatively, spin-on cap 30 may be cured during the furnace or hot plate cure of the next level. The curing step of the present invention is carried out using conventional conditions well known to those skilled in the art, including a hot plate bake step or furnace heating. In the present invention, it is preferred to use a curing step that includes furnace baking. Although the conditions for curing may vary, typically, hot plate baking is carried out at temperature of from about 250° to about 500° C. for a time period of from about 30 to about 500 seconds, while the furnace baking step is carried out at a temperature of from about 200° to about 500° C. for a time period of from about 15 minutes to about 3.0 hours.

FIG. 2 illustrates an alternative interconnect structure that can be formed in the present invention. Specifically, the interconnect structure shown in FIG. 2 is identical to FIG. 1G except that the interlevel dielectric 12 includes top dielectric layer 50 and bottom dielectric 54 which are separated by buried etch stop layer 52. In accordance with the present invention, etch stop layer 52 provides etch selectivity with respect to the underlying dielectric. Thus for example, when the underlying dielectric is composed of an organic dielectric material, then the etch stop layer is typically composed of an inorganic dielectric material. Moreover, when the underlying dielectric is composed of an inorganic dielectric, then the etch stop layer is typically composed of an organic dielectric material.

Another difference between FIG. 2 and FIG. 1G is that spin-on cap 30 includes RIE stop layer 32 formed thereon by conventional deposition processes such as CVD, plasma-assisted CVD, spin-on coating and other like deposition process. It is highly preferred that RIE stop layer 32 be formed by spin coating and that it be also composed of a low-k inorganic or organic dielectric material. In this drawing, spin-on cap 30 may be referred to as a bilayer since it includes the RIE stop layer. The thickness of this etch stop layer may vary, but typically it has a thickness of from about 5 to about 100 nm.

Figure 3:
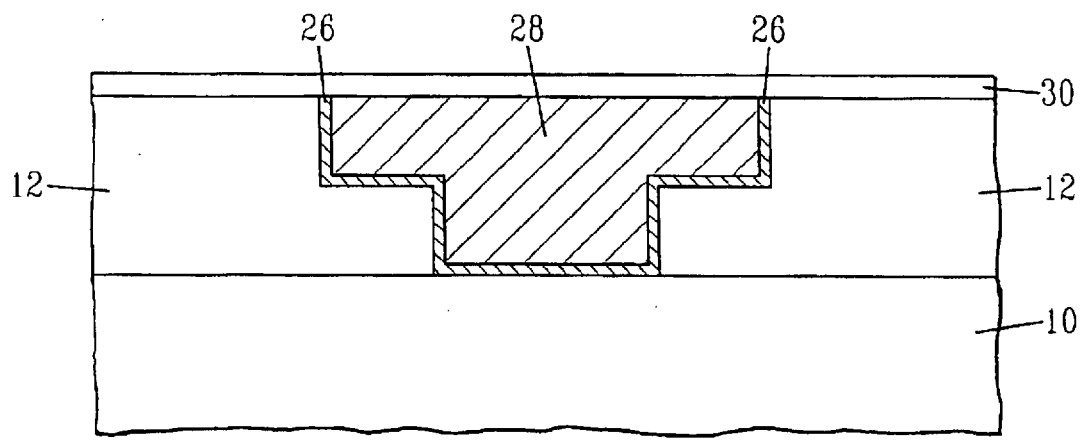
FIG. 3 shows a cross-sectional view of an alternative Cu interconnect structure of the present invention wherein a hard mask is not present in the structure.

FIG. 3 illustrates another alternative interconnect structure of the present invention. Specifically, the interconnect structure shown in FIG. 3 comprises substrate 10, patterned inorganic interlevel dielectric 12 having Cu filled regions 28 that are lined with liner material 26, and spin-on cap 30. Note that in this alternative embodiment of the present invention, no hard mask is present in the structure. The structure shown in FIG. 3 is formed utilizing the inventive method of the present invention except that no hard mask is formed in the structure.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A Cu interconnect structure comprising:
a substrate having a patterned low-k interlevel dielectric located thereon, said patterned low-k interlevel dielectric having an effective dielectric constant of about 3.5 or less;
a Cu conductive region formed within said patterned low-k interlevel dielectric;
a polish stop layer on surfaces of said patterned low-k interlevel dielectric not containing said Cu conductive region; and a spin-on cap located atop only horizontal surfaces of said Cu conductive region and said polish stop layer, wherein said spin-on cap comprises (i) a low-k dielectric having a dielectric constant of about 3.5 or less selected from the group consisting of a benzocyclobutene, aromatic thermosetting polymeric resins, silsesquioxanes, methylsilsesquioxane, hydrido-silsesquioxane, a methylsilsesquioxane-hydrido silsesquioxane copolymer, tetraethylorthosilicate, and organosilanes; and (ii) at least one additive selected from the soup consisting of cyanide compounds, multidentate ligands including multidentate amines, phthalocyanine, bipyridine, and etahylenediamine tetraacetate (EDTA), wherein said at least one additive is capable of binding Cu ions, and is soluble in the spin-on low-k dielectric cap.

2. The Cu interconnect structure of claim 1 wherein said substrate is a dielectric layer, a wiring layer, an adhesion promoter, a buried etch stop layer, a semiconductor wafer or any combinations thereof.

3. The Cu interconnect structure of claim 2 wherein and substrate is the semiconductor wafer.

4. The Cu interconnect structure of claim 1 wherein said interlevel dielectric is a multilayered interlevel dielectric.

5. The Cu interconnect structure of claim 4 wherein said multilayered interlevel dielectric includes a buried etch stop layer between each successive dielectric layer.

6. The Cu interconnect structure of claim 1 wherein said interlevel dielectric is an organic dielectric.

7. The Cu interconnect structure of claim 6 wherein said organic dielectric includes a material comprising C, O and H.

8. The Cu interconnect structure of claim 7 wherein said organic dielectric is an aromatic thermosetting polymeric resin.

9. The Cu interconnect structure of claim 6 wherein said organic dielectric is porous.

10. The Cu interconnect structure of claim 9 wherein said porous organic dielectric has a pore size of from about 1 to about 50 um at a volume percent porosity of from about 5 to about 35%.

11. The Cu interconnect structure of claim 1 wherein said interlevel dielectric is an inorganic dielectric.

12. The Cu interconnect structure of claim 11 wherein said inorganic dielectric comprises Si, O and H, and optionally C.

13. The Cu interconnect structure of claim 12 wherein said inorganic dielectric is a silsesquioxane, methylsilsesquioxane, hydrido-silsesquioxane, a methylsilsesquioxane-hydrido silsesquioxane copolymer, tetraethylorthosilicate, organosilanes or any other Si-containing material.

14. The Cu interconnect structure of claim 11 wherein said inorganic dielectric is porous.

15. The Cu Interconnect structure of claim 14 wherein said porous inorganic dielectric has a pore size of from about 5 to about 500 Å at a volume percent porosity of from about 5 to about 80%.

16. The Cu interconnect structure of claim 1 wherein said Cu conductive region further includes a liner material.

17. The Cu interconnect structure of claim 16 wherein said liner material comprises TN, TaN, Ti, Ta, W, WN, Cr, Nb or multilayer combinations thereof.

18. The Cu interconnect structure of claim 1 wherein said polish stop layer is a low-k, spin-on organic or inorganic dielectric.

19. The Cu interconnect structure of claim 1 wherein said spin-on cap comprises benzocyclobutene.

20. The Cu interconnect structure of claim 1 wherein said at least one additive is phthalocyanine.

21. The Cu interconnect structure of claim 1 wherein maid spin-on cap further comprising a reactive-ion etch (RIB) stop layer.

22. A Cu Interconnect structure comprising:
a substrate having a patterned low-k inorganic interlevel dielectric formed thereon, said patterned low-k inorganic interlevel dielectric having an effective dielectric constant of about 3.5 or less; a Cu conductive region formed within said patterned low-k inorganic interlevel dielectric; and a spin-on cap located atop only horizontal surfaces of said Cu conductive region and said inorganic interlevel dielectric, wherein said spin-on cap comprises (i) a low-k dielectric having a dielectric constant of about 3.5 or less selected from thin group consisting of a benzocyclobutene, aromatic thermosetting polymeric resins, silsesquioxane, methylsilsesquioxane, hydrido-silsesquioxane, a metylsilsesquioxane-hydrido silsesquioxane copolymer, tetraethylorthosilicate, and organosilanes; and (ii) at least one additive multidentate ligands including multidentate amines, phthalocyanine, bipyridine, and ethylenediamine tetraacetate (EDTA), wherein said at least one additive is capable of binding Cu ions, and is soluble in the spin-on low-k dielectric cap.

* * * * *

UNITED STATES PATENT AND TRADEMARK OFFICE
CERTIFICATE OF CORRECTION

PATENT NO. : 6,724,069 B2
DATED : April 20, 2004
INVENTOR(S) : Timothy J. Dalton et al.

It is certified that error appears in the above-identified patent and that said Letters Patent is hereby corrected as shown below:

Column 9,
Line 23, "soup" should read -- group --
Line 25, "etahylenediamine" should read -- ethylenediamine --
Line 33, "and" should read -- said --
Line 52, "50 um" should read -- 50 nm --

Column 10,
Line 13, "Interconnect" should read -- interconnect --
Line 28, "maid" should read -- said --
Line 29, "(RIB)" should read -- (RIE) --
Line 31, "Interconnect" should read -- interconnect --
Line 42, "thin" should read -- the --
Line 48, after "additive" insert -- selected from the group consisting of cyanide compounds --

Signed and Sealed this

Fourth Day of January, 2005

JON W. DUDAS
*Director of the United States Patent and Trademark Office*